United States Patent [19]

Kawachi

[11] Patent Number: 4,545,384

[45] Date of Patent: Oct. 8, 1985

[54] NUCLEAR MAGNETIC RESONANCE DIAGNOSTIC APPARATUS

[75] Inventor: Tatsuhiko Kawachi, Otawara, Japan

[73] Assignee: Tokyo Shibaura Denki Kabushiki Kaisha, Japan

[21] Appl. No.: 582,701

[22] Filed: Feb. 23, 1984

[30] Foreign Application Priority Data

Feb. 23, 1983 [JP] Japan .................. 58-28701

[51] Int. Cl.$^4$ .............................. A61B 5/05
[52] U.S. Cl. .................... 128/653; 128/722
[58] Field of Search ............. 128/653, 722, 727, 721, 128/660-661

[56] References Cited

U.S. PATENT DOCUMENTS

| | | | |
|---|---|---|---|
| 3,324,848 | 6/1967 | Domeier et al. | 128/722 |
| 3,508,539 | 4/1970 | Mahoney et al. | 128/727 |
| 3,954,098 | 5/1976 | Dick et al. | 128/661 |
| 3,993,995 | 11/1976 | Kaplan et al. | 128/653 |
| 4,202,215 | 5/1980 | Meyer | 128/660 |
| 4,306,567 | 12/1981 | Krasner | 128/721 |
| 4,403,184 | 9/1983 | Witt et al. | 128/660 |
| 4,463,763 | 8/1984 | Kuyano et al. | 128/661 |

OTHER PUBLICATIONS

Fenning, A New Method of Recording Physiologic Activities, The Journal of Laboratory & Clinical Medicine vol. 22, Sep. 1937, pp. 1279-1284.

Bradshaw, A Change of Capacitance Method for the Measurement of Mechanical Displacements, Jun. 1945, pp. 112-114.

Primary Examiner—Kyle L. Howell
Assistant Examiner—Ruth S. Smith
Attorney, Agent, or Firm—Finnegan, Henderson, Farabow, Barrett & Dunner

[57] ABSTRACT

Nuclear magnetic resonance diagnostic apparatus which forms an image of a slice of an object, including an apparatus for detecting NMR signals induced from an object with a condenser and a resonance circuit being provided with a receiving coil which surrounds the object, peakhold means for receiving the NMR signals generated from the resonance circuit to retain the maximum value in the NMR signals in the predetermined order which are picked up in every excitation cycle of the spins, and means for controlling the selection of the NMR signals when the retained value by the peak-hold means is in the synchronous level set previously, utilizing the variation of the NMR signal level in accordance with the variation of floating capacitance of the resonance circuit, which is altered according to the living motion of the object, to detect the state of the living motion, while thereby selecting the NMR signals in the predetermined state to utilize them into image reconstruction.

5 Claims, 9 Drawing Figures

NUCLEAR MAGNETIC RESONANCE DIAGNOSTIC APPARATUS

FIELD OF THE INVENTION

This invention relates to a nuclear magnetic resonance (NMR) diagnostic apparatus in which NMR signals, which are induced by specific atomic nuclei in certain tissues of an object such as a human body, can be measured in a noninvasive manner from outside of the object utilizing nuclear magnetic resonance phenomena, thereby providing useful information for medical diagnostic purposes.

BACKGROUND OF THE INVENTION

Computerized tomography (CT) apparatus has been employed recently to produce an image of a slice of an object, by constructing such an image with a computer, using either X-ray absorption data or NMR signals, which are obtained in a variety of projective directions in order to obtain an image of the desired slice of the object.

While producing a tomographic image of, for example, an abdomen of an animal utilizing such CT apparatus, a resultant image appears to be indistinct or blurred due to a shift in the position of the internal organs resulting from the respiration or the like of the object. In particular, in the nuclear magnetic resonance diagnostic apparatus (to be referred to as the "NMR-CT" hereinafter), when conducting tomographic imaging of the abdomen, chest, etc. of a human body, the resulting images noticeably appear to be blurred due to the influence of the respiration during the length of the time period, usually several minutes, which is necessary to collect the projection data in the various directions in a slice of the object.

Due to the foregoing problem, this invention devises an apparatus which combines the NMR-CT with a respiration synchronizing device. This combination operates by collecting the projection data in a slice of an object to be examined in synchronization with, for example, a breathing period corresponding to the respiration characteristic curve. This invention next produces an image using the collected projection data in the various projective directions. As a result, a more distinct image is formed which has almost no blur since the projection data is collected with the same phase time as the respiration cycle of the object.

In the prior art, a respiration synchronizing device has been available as a so-called impedance method wherein a respiration characteristic curve is obtained from the variations in the object impedance due to respiration while conducting minute high frequency current through the object.

In utilizing the above-described conventional respiration synchronizing device, however, the NMR-CT magnetic field is disturbed by another magnetic field which is generated at the time of flowing a current through the object, thereby making it impossible to detect NMR signals, since the NMR-CT is an apparatus utilizing an NMR phenomenon with an extremely uniform magnetic field.

Alternatively, a method employing a respiration meter might be devised as the respiration synchronizing device. A respiration meter measures the breathing volume of a human body through its mouth or nose, and as such, some of the instruments must be attached to the proper position on the face, thereby making the meter inconvenient.

Up to now, there has not been in existence a respiration synchronizing device that is suitable for an NMR-CT.

SUMMARY OF THE INVENTION

This invention provides for a nuclear magnetic resonance (NMR) diagnostic apparatus which determines the state of respiration from the detected NMR signals, and which produces an image of the slice part which is ready to accept the influence of respiratory motion, such as the tomographic image of the abdomen or chest of an object, or a layered tomographic image, without the appearance of a blur in the image and the employment of an implement for respiratory detection.

Briefly stated, in one embodiment of this invention, an NMR diagnostic apparatus is used to detect NMR signals based on NMR phenomena which are induced by magnetically exciting the spins of specific atomic nuclei substances. Such spins correspond to gradient magnetic fields used in a variety of directions in a slice of the object, with a resonance circuit which includes a condenser and a receiving coil which surrounds the object. The NMR signals are Fourier transformed to obtain the projection data of the spin density distribution of the specific atomic nuclei substances in the various directions. An image of a slice in an object is produced from the projection data. For a particular slice, such data are produced from the spin density distribution of the specific atomic nuclei substances in that slice.

The NMR apparatus comprises peak-hold means for receiving the NMR signals sent by a resonant circuit, which means holds the maximum value in the NMR signals in the order in which such signals are detected in every excitation cycle of the spins, means for controlling the selection of the NMR signals when the maximum value is above a previously set level, and means for utilizing the variation of the NMR signal level in accordance with the variation of a floating capacitance of the resonance circuit, which capacitance is altered according to movement due to breathing of the object. Such means for utilizing the variation of the NMR signal level detects the state of movement to breathing, and thereby uses such states to select the NMR signals in a predetermined state and uses the detected NMR signals to form an image.

In another embodiment of this invention, the selective command means in the apparatus may be provided with a synchronizing device for generating a synchronous signal at the time when the output of the peak-hold means is in the range of the synchronous level, and means for picking up the detected NMR signal only at the time when the synchronous signal is generated from the synchronizing device.

DESCRIPTION OF THE PREFERRED EMBODIMENT

Reference will now be made in detail to the present preferred embodiment of the subject invention as illustrated in the accompanying drawings.

Figure 1:
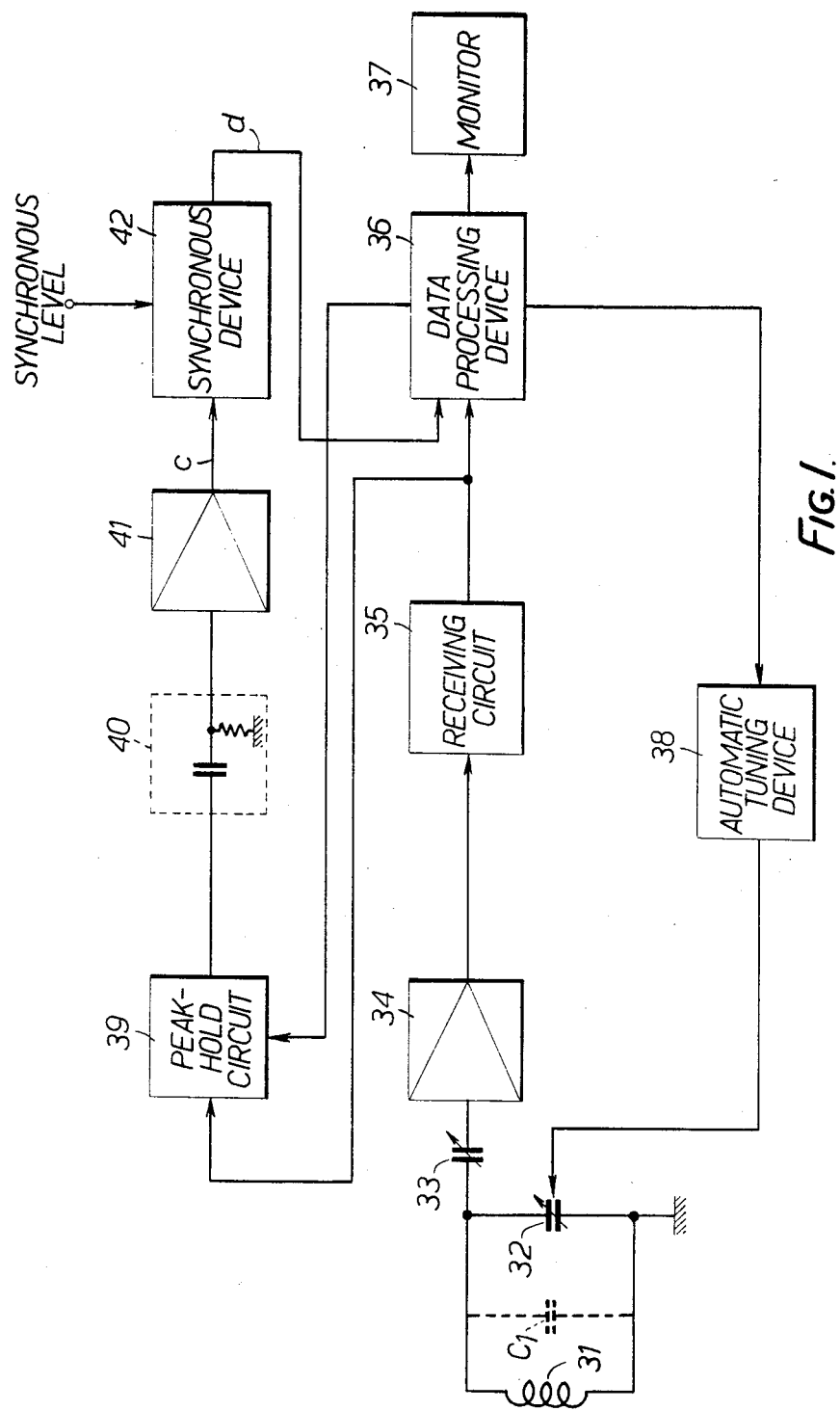
FIG. 1 is a schematic block diagram illustrating the construction of an embodiment of the present invention.
Figure 2:
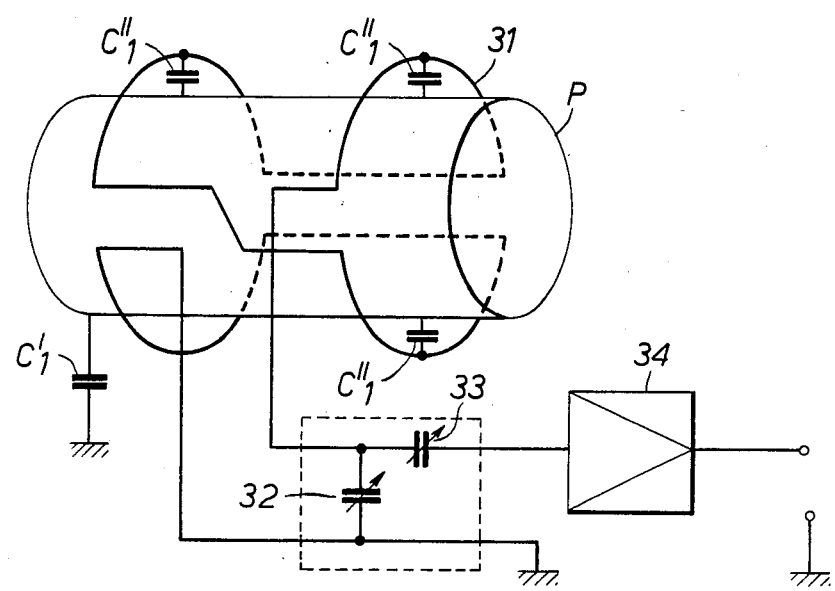
FIG. 2 is a schematic circuit illustrating the resonance circuit including a receiving coil of FIG. 1.

In FIGS. 1 and 2, a saddle-shaped receiving coil 31 which receives NMR signals is positioned around an object. A variable condenser 32 which can have its electrostatic capacitance altered by a control signal which is described in detail hereinafter, is connected in parallel with the receiving coil 31, making a resonant circuit. A variable condenser 33 connected to the resonant circuit matches the resonant circuit and a pre-amplifier 34 which is connected to the variable condenser 32. The pre-amplifier 34 amplifies, up to several hundred fold, the weak NMR signals detected by the receiving coil 31.

In FIG. 1 receiving circuit 35 connected to the pre-amplifier 34 eliminates a high-frequency component in the NMR signals and detects the NMR signals which were amplified by the pre-amplifier 34 so that data processing is possible therefor. The outputs of such a receiving circuit 35 are transferred to a data processing device 36 which can be a computer.

The data processing device 36 digitizes the output data of the receiving circuit 35 with an analog-to-digital (A/D) converter and obtains projection data by Fourier transforming the digitized data. The device 36 also selectively stores the collected projection data in synchronism with the synchronous signals generated from a synchronizing device which will be described in detail hereinafter, and forms an image using the selectively stored projection data.

In the data processing device 36, the digital data may be selectively chosen during receiving the synchronous signals and such data may be Fourier transformed and collectively stored as projection data. Although the digitized data from data processing device 36 could be Fourier transformed at the same time as the data are digitized, such data are instead transformed after collectively storing such data, and thus, the burden on data processing device 36 is lessened.

The data processing device 36 further is provided with the function of controlling the above-described automatic timing device and peak-hold circuit.

A monitor 37 displays the image representing the tomographic data, which image was produced by the data processing device 36.

An automatic tuning device 38 varies the electrostatic capacitance of the variable condenser 32 in accordance with the control signal outputs from the data processing device 36. The data processing device 36 sends control signals for initially setting the outputs from the receiving circuit so that the point of resonance of the resonant circuit, which comprises the receiver coil 31 and variable condenser 32, is adjusted to the same frequency as the NMR signal frequency of the hydrogen nuclei within the object. After establishing the initial setting, such a state is maintained.

A peak-hold circuit 39 receives the output signals from the receiving circuit 35 and holds the maximum value of those output signals for a period designated by the data processing device 36. A capacitor resistor (RC) circuit 40 eliminates the D.C. voltage component in the output of the peak-hold circuit 39. An amplifier 41 amplifies the outputs of the RC circuit 40. A synchronous device 42 compares the maximum value outputted from the amplifier 41 with a previously set synchronous level, e.g., a reference value for detecting the synchronous level, and outputs synchronous signals into the data processing device 36 when the output of maximum value is the scope of synchronous level. $C_1$ represents a floating capacitance between the receiving coil 31 and the object.

The operation of the above-described apparatus is described below.

Figure 4:
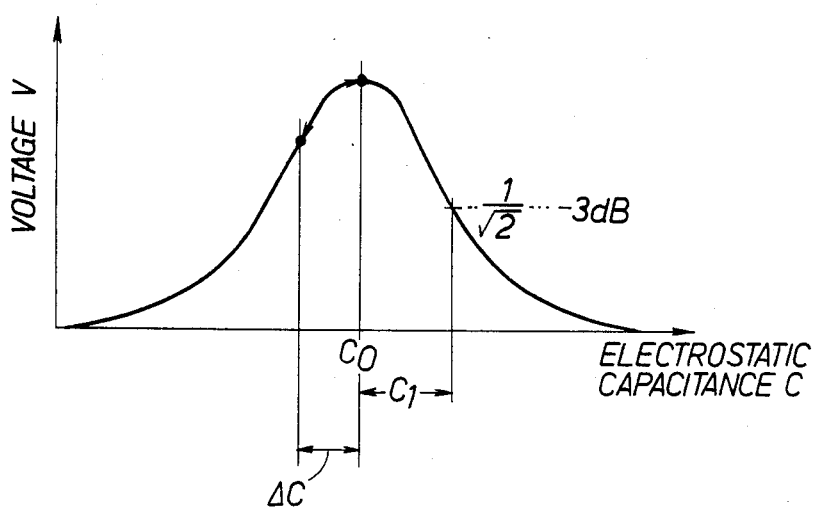
FIG. 4 is a resonance curve which illustrates the relationship of the output voltage to a shift in the resonance point as used in the invention.

As shown in FIG. 2, the saddle-shaped receiving coil 31 which is installed around the object P and the variable condenser 32 which resonates with the coil 31 are used to detect the NMR signals which are induced from the object P. However, since the NMR signals are very weak, the resonant circuit is required to have a very large quality factor Q ($Q = C_0/C_1$) for efficiently detecting the NMR signals, thereby making the resonance characteristic curve acute as shown in FIG. 4. The amplitude of the detected NMR signals, therefore, varies greatly with a minor change of the electrostatic capacitance in the resonant circuit.

Floating capacitances $C_1'$ and $C_1''$ exist between the object P and the receiving coil 31, as shown in FIG. 2. The values of capacitances $C_1'$ and $C_1''$ correspondingly vary with the distance between the abdomen of the object P and the receiving coil 31, as the object moves due to breathing.

Figure 3:
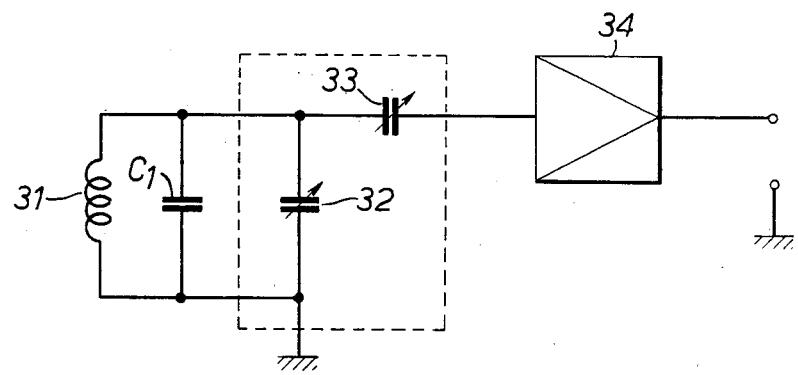
FIG. 3 shows an equivalent circuit of FIG. 2.

As shown in FIG. 3, the floating capacitances $C_1'$ and $C_1''$ are represented by an equivalent floating capacitance $C_1$ which is coupled to both ends of the receiving coil 31. In FIG. 3, $C_0$ designates the composite electrostatic capacitance of the floating capacitance $C_1$ and variable condenser 32, which capacitance $C_0$ constitutes the resonant circuit with the receiver coil 31.

If the abdomen of the object P gradually contracts, for example, while exhaling, the distance between the object P and receiver coil 31 increases in accordance therewith. Since the floating capacitance $C_1$ decreases, the aforementioned composite electrostatic capacitance, therefore, decreases from $C_0$ by $\Delta C$, thereby shifting the point of resonance of the resonant circuit. As a result, the amplitude of an NMR signal detected through the receiver coil 31 in the resonant circuit decreases.

On the other hand, while inhaling, the distance between the object P and the receiver coil 31 gradually decreases because the abdomen gradually increases in size. As a result, since the floating capacitance $C_1$ gradually increases, the resonance of circuit with the aforementioned composite electrostatic capacitance gradually approaches the point of resonance of the NMR signal frequency of a hydrogen atomic nucleus. Consequently, the amplitude of the NMR signal as detected through the receiver coil 31 gradually increases.

According to the present invention, the apparatus detects the NMR signals at a certain specified state during respiratory movement utilizing such phenomenon and projection data at the same state are obtained and used to construct a tomographic image having almost no blur. The NMR signals detected by the receiving coil 31 at the time of the initial state are amplified, demodulated and filtered by the receiving circuit 35 and are transferred to the data processing device 36. The data processing device 36 digitizes such received data.

Since the composite electrostatic capacitance in the resonant circuit is varied with the value of the floating capacitances which capacitances differ with the physique of an object, the slice position thereof to be examined and the like, the data processing device 36 sends control signals referring to the above-mentioned digital data toward the automatic tuning device 38, so as to adjust the tuning point in the resonant circuit to the desired resonant frequency. Receiving such control signals, the automatic tuning device 38 operates to adjust the electrostatic capacitance of the variable condenser 32 for correcting a resonant frequency.

Since the amplitude of the NMR signal detected by the receiver coil 31 in the resonant circuit varies, the digital data obtained by demodulation and filtering similarly vary. Accordingly, the digital data which are successively detected, as described above, are used with the data processing device to adjust the resonant frequency of the tuned circuit to the desired value 36 so that the NMR signal can be received at an optimum level.

When such an adjustment has been determined, the data processing device 36 controls the automatic tuning device 38 by sending a control signal so as to keep the variable condenser 32 in the resonant circuit at the proper electrostatic capacitance value. Then the collection of NMR signals is initiated.

That is, the NMR signals which are successively induced from an object P are detected by the receiving coil 31 in the resonant circuit, amplified by the amplifier 34 and applied to the receiving circuit 35. The detected and filtered NMR signals received by the receiving circuit 35 are applied to both the data processing device 36 and peak-hold circuit 39.

This peak-hold circuit 39 receives and holds a peak level of the input NMR signal under control of the data processing device 36. The received-hold level is amplified by the amplifier 41 after filtering out a D.C. component, and compared with a reference synchronous level in the synchronous device 42. The synchronous device sends a synchronous signal d to the data processing apparatus 36 during the hold level in the recognizable scope of synchronous level.

Meanwhile, the data processing apparatus 36 converts the output from the receiving circuit 35 to digital data and proceeds to successively store the digital data which are applied during the synchronous signal being issued. After collecting NMR signals in the various directions induced from a slice of the object P to be examined, the collected data are Fourier transformed as projection data. As a result, desired spatial data are obtained, and from that data an image is formed. This image is transferred to the monitor 37 for its display. Therefore, even if there is a shift in the position of the organs due to breathing motion of the object, the projection data are always obtained at the same cyclic point during the breathing motion. This results in an image being produced with substantially no blur.

The operation of a respiration synchronous detection system which is the subject matter of the invention is described below.

Figure 5:
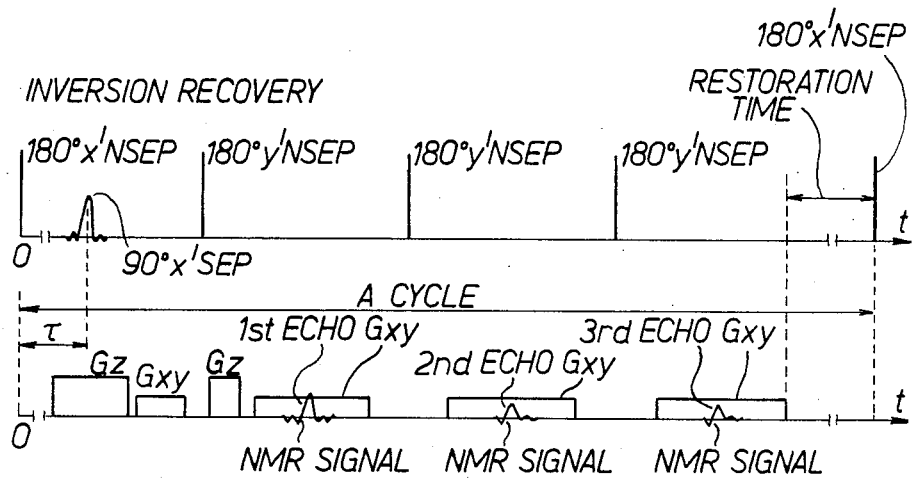
FIG. 5 is a timing diagram for explaining an NMR signal sequence of an inversion recovery typed NMR-CT.

FIG. 5 is a timing chart illustrating an example of the collecting sequence of NMR signals in an NMR-CT. In FIG. 5, a nonselective excitation high frequency pulse (NSEP) for tilting macroscopic magnetic moments by 180°, is supplied several times in one cycle, i.e., during an excitation interval for the generation of NMR phenomena. In addition, a selective excitation high frequency pulse SEP for tilting the macroscopic magnetic moments by 90° is applied between the first and second non-selective excitation high frequency pulses NSEP while applying a gradient magnetic field G, thereby an NMR signal is detected several times. These detected NMR signals are designated the first echo, second echo, through the nth echo, respectively, in the order in which the NMR signal was detected.

Projection data are calculated using the first echo to the nth echo of the NMR signals which have been collected in a cycle, i.e., an excitation interval for the generation of NMR phenomenon as to the spin of an atomic nucleus.

The data processing apparatus 36 controls delivering only the first echo of NMR signals into the peak-hold circuit 39. This peak-hold circuit 39 holds the peak value of the delivered first echo of NMR signals. At this time, if the expanding and contracting motion of the abdomen due to respiration appear as shown in FIG. 6a, then the amplitude of the first echo of NMR signals is altered according to the variation curve d of the abdomen motion as shown in FIG. 6b.

Figure 6:
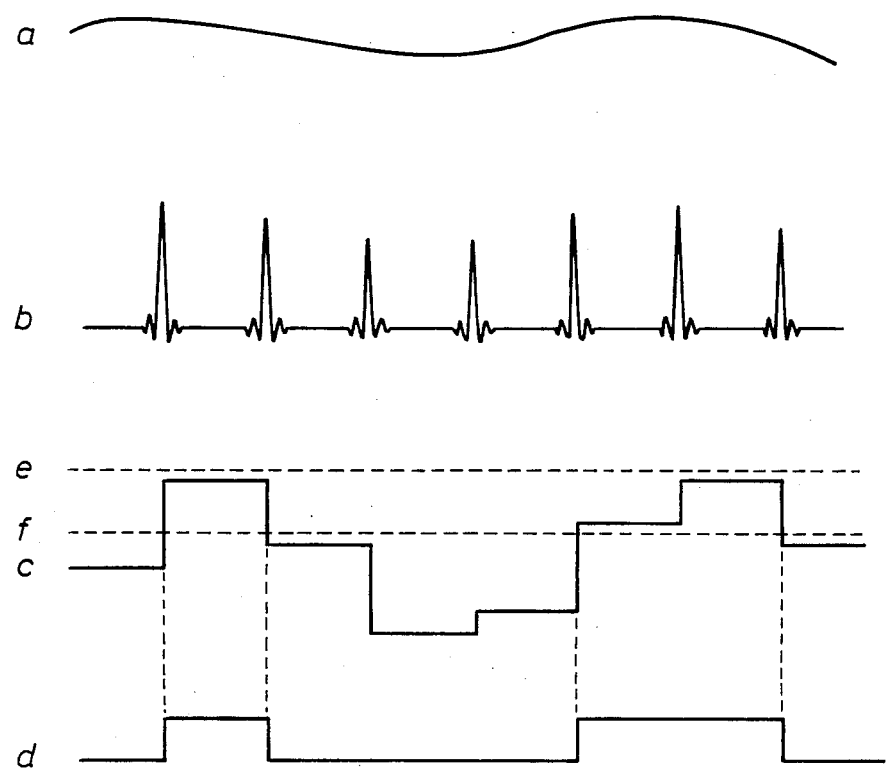
FIG. 6 is a timing diagram for explaining the operation of the invention.

As a result, if the maximum value of the first echo b of NMR signals is held every excitation cycle by the peak-hold circuit 36 and amplified after the elimination of D.C. component, then an abdomen variation signal is obtained as shown in FIG. 6c.

When the abdomen variation signal c exists between the upper limit value (FIG. 6e) and the lower limit value (FIG. 6f) of a synchronous level previously set externally, it is set to cause a synchronous signal d to be generated from the synchronizing device 42. In this case, if the range of the synchronous level described above is set to where, for example, the expanding of the abdomen corresponds to substantially the upper limit of inhaling, then the synchronous signal d corresponds to the state where the expanding of the abdomen is in the range of such an upper limit. It is possible to collect the projection data in the substantially same state of abdomen expanding by collecting to store the first echo, and nth echo of NMR signals during the synchronous signal d being obtained to find projection data by calculation.

Therefore, an image with no blur can be formed after the collection of the necessary projection data has been completed. Also, it is not necessary to attach a specific detection device for respiratory synchronization to an object in the present invention because synchronizing signals are obtained from the NMR signals.

It will be apparent, to those skilled in the art, that modifications and variations can be made in the preferred embodiment disclosed herein without departing from the scope or the spirit of the invention.

Figure 7:
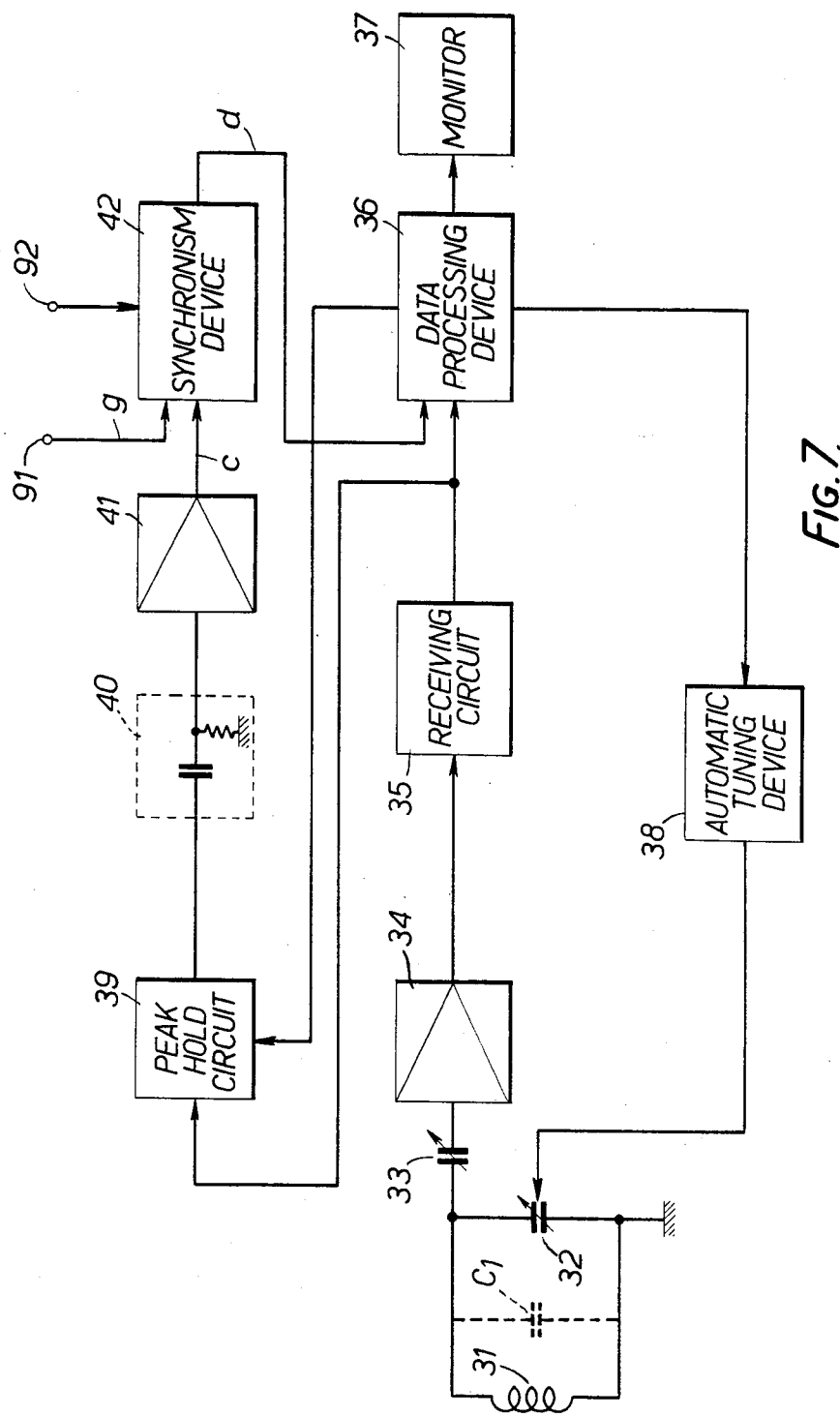
FIGS. 7 and 8 are schematic block diagrams illustrating the construction of other embodiments of the invention.

For example, as shown in FIG. 7, an electrocardiogram input terminal 91 additionally may be connected to the synchronism device 42 to synchronize also with the R wave of the electrocardiogram besides the abdomen expanding. According to such a configuration, it is possible to perform the tomography of a chest, i.e., one including the heart by generating a synchronous signal d only when the electrocardiogram and abdomen expanding signals are synchronized with each other. A terminal 92 may be utilized for inputting a synchronous level and signals other than the electrocardiogram R wave may be used.

Figure 8:
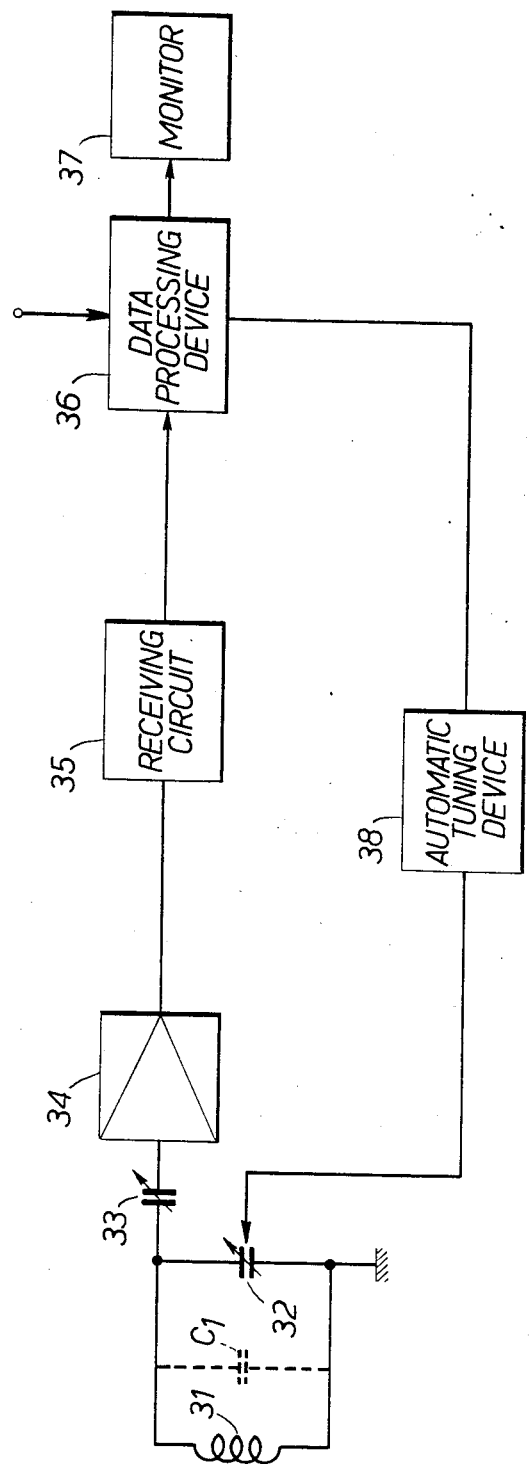

Furthermore, as shown in FIG. 8, as another embodiment, a circuit may be constructed where a synchronous detection system part is eliminated from the configuration in FIG. 1. In this case, a program installed within the data processing device 36 alternately executes the functions of both the hold circuit 39 and synchronism device 42 with which the synchronous system is instituted. That is, the outputs of the receiving circuit 35 are successively transmitted to the data processing device 36, those outputs being processed according to the software. Its flow chart is shown in FIG. 9.

Figure 9:
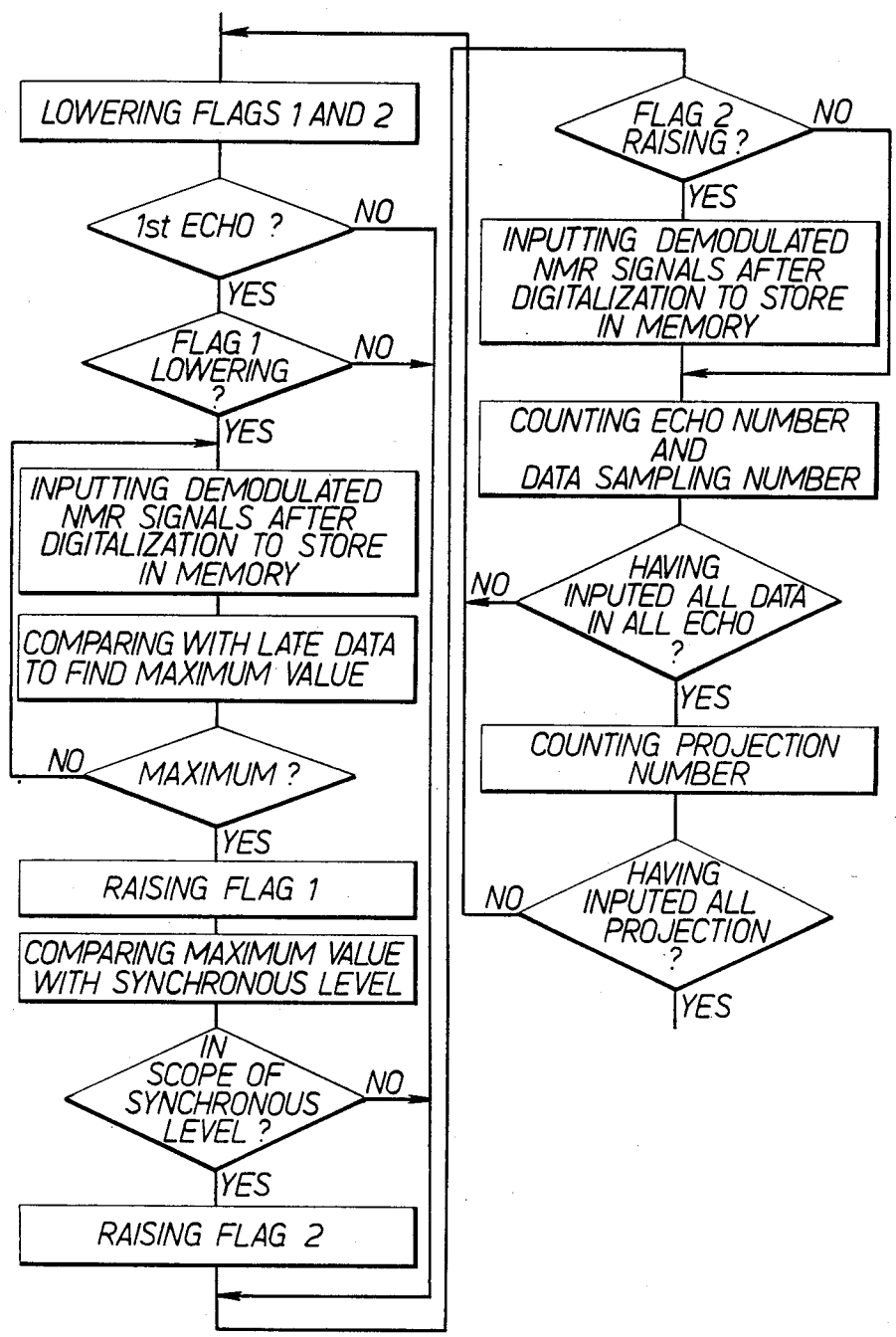
FIG. 9 is a flow-chart representing an example of a program for producing synchronous detection in the apparatus of FIG. 8.

In FIG. 9, after initially setting both a flag 1 for knowing whether the maximum value has been found or not and a flag 2 corresponding to the synchronous signal d, the stored data in the memory are read out, this read out data being compared to determine whether it is the first echo in reference to the appearing order of NMR signals every excitation cycle.

If it is the first echo, then the flag 1 is checked to determine which state it is in. If it is in the lower state, then the demodulated NMR signals are digitized and stored in the memory of the data processing device 36. Subsequently, they are compared to determine whether or not the stored content is greater than the previously stored data, and to find their maximum value. As a result, if the maximum value has been found, after raising the flag 1, that value is compared with a synchronous level. Then if the maximum value is within the range (scope) of the synchronous level, then flag 2 is raised. If flag 2 is in the raising state, then the demodulated NMR signals are digitized and stored in the memory of the data processing device 36.

In addition, the number of echoes and the number of data sampled are counted. A decision is then made to determine whether or not all of the data of all the echoes are inputted, and if they are not, the apparatus returns to the state of initial set to carry out the above-described operation again. If they are so inputted, the number of projection data is counted and it decides whether all the projection data are inputted. This time if they are not inputted, the apparatus returns in the state of initial set to carry out the above-described operation again. If they are so, such an operation has been finished completely.

Also, in the decision routine of determining whether the setting of the first echo and in the decision routine of whether the flag 1 is in the lowering state or not, if it is not, the operation is subject to jump into the decision routine of whether the flag 2 is in the raising state or not.

By performing such programming procedure, the projection data that are in synchronization with the respiration are obtained from the software operation in the data processing device 36. Thereby it is possible to form an image with no blur and restrict the influence due to the variation of organ position in accordance with the respiration motion.

In addition, in the above embodiment, although both the upper limit value and lower limit value are used for the set of synchronous level, only one of them may be adopted as a threshold level. Also, since projection data are better ones in the state that each part of the internal organ in the slice to be examined is in the same position on their motion cycle, the position that is permitted to synchronize may be arbitrarily set in the range to satisfy such a condition.

What is claimed is:

1. A nuclear magnetic resonance (NMR) diagnostic apparatus for forming an image of a slice of an object, said apparatus including means for inducing NMR signals in the object, comprising:
    receiving means including resonant circuit means responsive to NMR signals for producing output signals;
    data processor means coupled to said receiving means for (1) digitizing the output signals to digital data, (2) Fourier transforming the digital data into projecting data, (3) storing said projection data, (4) generating signals indicative of time periods, and (5) generating control signals in response to the receipt of a synchronous signal;
    peak-hold means coupled to said receiving means and responsive to said time period signals for holding a maximum value from a set of output signals received during each of said time period;
    synchronous means coupled to said peak-hold means for comparing said maximum value outputted from said peak-hold means with a reference level, and outputting a synchronous signal to said data processor in response to said maximum value being greater than said reference level to produce a control signal;
    automatic tuning means coupled to said data processor means and to said resonant circuit means responsive to the receipt of a control signal from the data processor means, for adjusting the resonance of said resonant circuit means, to keep said resonant circuit means at a predetermined setting for collecting NMR signals; and
    a monitor coupled to said data processor means for displaying said image from said projection data.

2. The NMR apparatus as set forth in claim 1 wherein said resonant circuit includes a variable capacitor means responsive to said automatic adjusting means for adjusting the resonance of said resonant circuit means.

3. The NMR apparatus as set forth in claim 1 wherein the NMR signals are generated by hydrogen nuclei in the object and said resonant circuit means includes a receiver coil and a variable capacitor means responsive to said automatic adjusting means for adjusting the resonance of said resonant circuit means to the same frequency as the NMR signal frequency of hydrogen nuclei within the object.

4. The NMR apparatus as set forth in claim 1 wherein said synchronous means further includes an electrocardiogram input for an electrocardiogram signal for synchronizing said synchronous signal with said electrocardiogram signal.

5. A nuclear magnetic response (NMR) diagnostic apparatus for monitoring the NMR of atomic nuclei substances of a body which is subjected to magnetic forces at a predetermined frequency, which comprises:
    a resonant circuit having a coil and an adjustable capacitor connected in parallel, said coil shaped to surround a portion of the body to form a floating capacitor between said coil and the body wherein the capacitance of the floating capacitor varies in accordance with movements of the body;
    means for tuning said adjustable capacitor to control said resonant circuit to operate at various resonant frequencies;
    means responsive to said coil detecting an NMR signal from the body being subjected to the magnetic forces for producing output frequency signals having amplitudes indicative of a characteristic of the body;

processor means for receiving said output frequency signals, for generating control signals to operate said tuning means, and for generating successive period setting signals;

peak hold circuit means responsive to said output frequency signals during generation of successive period setting signals for producing signals representing the level of the NMR signals;

means for comparing said NMR level signals with a predetermined reference level and accordingly generating a synchronous signal; upon said NMR level changing by a predetermined amount; and monitor means coupled to said processor means and responsive to said synchronous signal for displaying an image.

* * * * *